United States Patent [19]

Shaffer

[11] 4,189,298
[45] Feb. 19, 1980

[54] MULTILAMP PHOTOFLASH UNIT HAVING CONDUCTIVE ADHESIVE CONNECTION

[75] Inventor: John W. Shaffer, Williamsport, Pa.

[73] Assignee: GTE Sylvania Incorporated, Stamford, Conn.

[21] Appl. No.: 866,262

[22] Filed: Jan. 3, 1978

[51] Int. Cl.² .............................................. A23C 1/12
[52] U.S. Cl. .................................................... 431/359
[58] Field of Search ............... 431/357, 359, 364, 365; 428/323, 325, 327

[56] References Cited

U.S. PATENT DOCUMENTS

| 3,941,992 | 3/1976 | Blount et al. | 431/359 |
| 4,036,578 | 7/1977 | Herman | 431/358 |
| 4,098,945 | 7/1978 | Oehmke | 428/323 |
| 4,104,705 | 8/1978 | Levand, Jr. et al. | 431/359 |

Primary Examiner—Albert W. Davis
Assistant Examiner—Wesley S. Ratliff, Jr.
Attorney, Agent, or Firm—Edward J. Coleman

[57] ABSTRACT

A photoflash unit comprising a plurality of high-voltage type flashlamps mounted on a printed circuit board containing circuitry for sequentially igniting the flashlamps in response to successive high-voltage firing pulses applied thereto. One lead-in wire of each of the flashlamps is connected to a common circuit conductor. An electrically conductive reflector unit is positioned between the lamps and the circuit board. The reflector unit is connected to the common circuit conductor by means of a pliable, electrically conductive adhesive material, whereby the reflector unit functions as an electrical shield for the circuitry.

5 Claims, 4 Drawing Figures

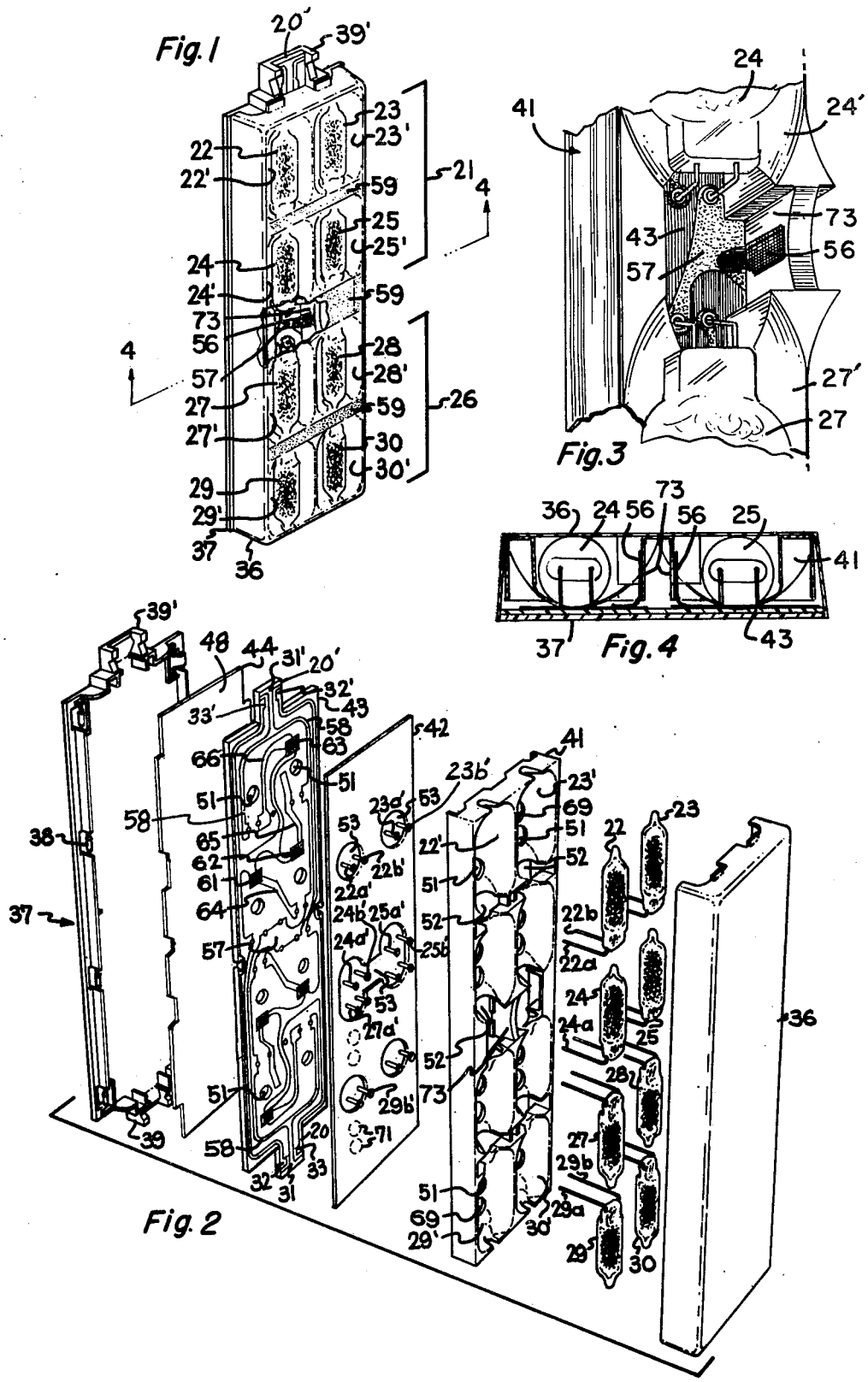

MULTILAMP PHOTOFLASH UNIT HAVING CONDUCTIVE ADHESIVE CONNECTION

BACKGROUND OF THE INVENTION

This invention relates to multilamp photoflash units having circuit means for igniting the flashlamps, and more particularly, to high-voltage photoflash arrays with improved means for providing electrostatic protection.

Numerous multilamp photoflash arrangements with various types of sequencing circuit have been described in the prior art; paticularly, in the past few years. A currently marketed photoflash unit (described in U.S. Pat. Nos. 3,894,226; 3,912,442; 3,935,442; 3,937,946; 3,941,992; 3,952,320 and 4,017,728 and referred to as a flip flash) employs high-voltage type lamps adapted to be ignited sequentially by successively applied high-voltage firing pulses from a source such as a camera-shutter-actuated piezoelectric element. The flip flash unit comprises an elongated planar array of eight high-voltage type flashlamps each having a pair of lead-in wires connected to a printed circuit board by means of eyelets thereon. The circuit board is provided with switching circuitry for causing sequential flashing of the lamps, and an array of respectively associated reflectors are positioned between the lamps and the circuit board. The reflectors for the lamps can be made as a single reflector member shaped to provide multiple individual reflectors for the lamps. The reflector member preferably is electrically conductive, such as being made of metal or metal-coated plastic, and is electrically connected to an electrically "ground" portion of the circuitry on the circuit board; thus, the reflector member functions as an electrical shield reducing the possibility of accidental flashing of the lamps by an electrostatic voltage charge on a person or object touching or near the unit. Such accidental flashing is particularly prone to occur in this instance as the primers used in the high-voltage type flashlamps employed in such arrays are designed to be highly sensitive toward high-voltage discharges. Electrical energies as low as a few microjoules are sufficient to promote ignition of such primers and flashing of the lamps. This high sensitivity is needed in order to provide lamps that will function reliably from the compact and inexpensive piezo-electric sources that are practical for incorporation into modern miniature cameras. Typically, the high voltage pulses provided by the camera are in the order of 500 to 4000 volts.

The use of a conductive reflector unit as an electrostatic shield for the flip flash array is described in the aforementioned U.S. Pat. No. 3,935,442, wherein the reflector is connected to a ground point of the circuit board by means of a conductive U-shaped spring clip which engages a web portion of the reflector unit and extends against a conductive area on the circuit board. This clip-engaged conductive area on the circuit board comprises an enlarged portion of a common circuit conductor which is connected to one lead-in wire of each of the flashlamps. An alternative method of connecting the reflector to a "ground" point of the circuit board is described in the aforementioned U.S. Pat. No. 3,941,992, wherein FIG. 2 thereof shows a wire 77 connected between the metallized reflector and a common circuit run. Both of these reflector grounding methods share a basic deficiency in that initial electrical connection is not always established due to inevitable distortion of the plastic array components during manufacture and assembly. Loss of this mechanical (and electrical) contact renders the lamps of that array subject to unintentional electrostatic flashing.

Another problem found with these grounding methods is that the electrical contact is readily lost under humid conditions, principally because of galvanic corrosion of the thin, aluminized reflector coating at the point of contact.

SUMMARY OF THE INVENTION

In view of the foregoing, it is an object of this invention to provide a photoflash unit having an improved means for significantly reducing inadvertent electrostatic flashing of high-voltage lamps contained therein.

A principal object of the invention is to provide an automatable reflector grounding means for high voltage photoflash units that provides more fail safe electrical interconnection between the common circuit and the reflector, and which better retains the electrical interconnection upon exposure to high relative humidity.

Another object is to provide a less costly but more reliable means for connecting the conductive reflector unit to the common circuit run.

These and other objects, advantages and features are attained, in accordance with the principals of this invention, by the discovery that a more positive initial electrical contact between the reflector and common circuit conductor, as well as dramatically improved retention of contact under humid conditions, can be attained by use of a bead of conductive, pliable adhesive as the connecting means. More specifically, the adhesive material may comprise an adherent polymeric material mixed with a conduction-promoting particulate type additive. The adhesive material may be applied in measured doses from a needle-pointed caulk dispenser at a position on the photoflash unit which joins a web of the conductive reflector unit to a portion of the common circuit conductor run on the circuit board which is aligned with the reflector web. A preferred conductive ahdesive is moisture curing, room temperature vulcanizing silicone admixed with silver coated glass beads.

It appears that the contact points between the conductive particulate filler in the conductive adhesive and the metallized reflector surface are protected from destructive galvanic corrosion by the exclusion of moisture by the organic adhesive resin present. A degree of flexibility or pliability in the cured adhesive is desirable so as to reduce the likelihood of adhesive cracking, and resultant loss of electrical continuity, during handling, thermal cycling, squeezing of the array, or at other times. A further advantage of the conductive adhesive is that it is well adapted to automated production techniques and reduces the cost of the reflector-to-circuit board connection operation as compared to the previously employed U-shaped clip or wire connections.

BRIEF DESCRIPTION OF THE DRAWINGS

This invention will be more fully described hereinafter in conjunction with the accompanying drawings in which:

FIG. 1 is a perspective view of a multilamp photoflash unit with a portion of the housing broken away to show the conductive adhesive connection of the invention;

FIG. 2 is an exploded view of the photoflash unit of FIG. 1 showing the internal parts but excluding the conductive adhesive connection of the invention;

FIG. 3 is an enlarged fragmentary perspective view of a portion of the photoflash unit of FIG. 1 with the housing removed so as to show the location of the conductive adhesive connection according to the invention; and FIG. 4 is a sectional view taken on line 4—4 of FIG. 1 which shows the location of the conductor-adhesive connection according to the invention.

DESCRIPTION OF PREFERRED EMBODIMENT

The multilamp photoflash unit illustrated in the drawings is of the planar array type which contains a plurality of electrically fired flashlamps and is provided with a plug-in connector tab 20 at the lower side or end thereof, adapted to fit into a socket of a camera or flash adaptor. The array is provided with a second plug-in connector tab 20' at the top side or end thereof, whereby the array unit is adapted to be attached to the camera socket in either of two orientations, i.e., with either the tab 20 or tab 20' plugged into the socket. The array is provided with an upper group 21 of flashlamps 22, 23, 24, and 25, and a lower group 26 of flashlamps 27, 28, 29, and 30, the lamps being arranged in a planar configuration. Reflectors 22', etc., are disposed behind their respective flashlamps so that as each lamp is flashed, its light is projected forwardly of the array. The lamps are arranged and connected so that when the array is connected to a camera by the connector 20, only the upper group 21 of lamps will be flashed, and when the array is turned end for end and connected to the camera by the other connector 20', only the then upper group 26 of lamps will be flashed. By this arrangement, only the lamps relatively far from the camera lens axis are flashable, thus reducing the undesirable redeye affect.

The construction of the array comprises front and back housing members 36 and 37 which preferably are made of plastic and are provided with interlocking members 38 which can be molded integrally with the housing members and which lock the housing members together in final assembly to form a unitary flash array structure. In the preferred embodiment shown, the front housing member 36 is a rectangular concavity and the back housing member 37 is substantially flat and includes integral extensions 39 and 39' at the ends thereof which partly surround and protect the connect tabs 20 and 20' and also function to facilitate mechanical attachment to the camera socket. Sandwiched between the front and back housing members 36 and 37, in the order named, are the flashlamps 22, etc., an electrically conductive unitary reflector member 41 (preferably of aluminum-coated plastic) shaped to provide the individual reflectors 22', etc., an electrically insulating sheet 42, a printed circuit board 43 provided with integral connector tabs 20 and 20', and an indicia sheet 44 which may be provided with information and trademarks, and other indicia such as flash indicators (not shown) located behind the respective lamps and which change color due to heat and/or light radiation from a flashing lamp, thus indicating at a glance which of the lamps have been flashed and not flashed. As described in the aforementioned U.S. Pat. No. 3,894,226, small openings 71, indicated with dashed lines in FIG. 2, can be provided if desired through the sheet 42 in alignment with openings 51 and 69 in the reflector unit 41 to improve radiation transfer.

The indicia sheet 44 may be of paper or thin cardboard are provided with openings (not shown) where the flash indicators are desired and flash indicator material, such as a sheet-like heat sensitive plastic material, for example biaxially oriented polypropylene, which shrinks or melts when subjected to heat or radiant energy from an adjacent flashing lamp, thus effectively changing the color of the openings in the indicia sheet 44. A single flash indicator sheet 48 may be arranged over all of the flash indicator openings. Openings 51 are provided through the reflector unit 41 and the circuit board 43 to facilitate radiation from the flashing lamps reaching the flash indicator. The rear housing member 37 is transparent (either of clear material or provided with window openings) to permit viewing of the indicia on the indicia sheet 44. The front housing member 36 is transparent at least in front of the lamps 22, etc., to permit light from the flashing lamps to emerge forwardly of the array and may be tinted to alter the color of the light from the flashlamps.

The height and width of the rectangular array are substantially greater than its thickness, and the height and width of the reflector member 41, insulating sheet 42 and the circuit board 43 are substantially the same as the interior height and width of the housing member 36 to facilitate holding the parts in place.

The tab 20, which is integral with the circuit board 43, is provided with a pair of electrical terminals 31 and 32, and similarly the tab 20' is provided with a pair of terminals 31' and 32' for contacting terminals of a camera socket for applying firing voltage pulses to the array. Each tab is provided with a third terminal 33 and 33', respectively, which functions to electrically short the circuitry of the inactive lower group of lamps when the array is plugged into a socket. The terminals 31 and 31' are shown as having a lateral "T-bar" configuration for temporarily shorting the circuit terminals, while the array is being plugged in, to discharge any residual voltage charge in the firing pulse source and also to reduce the likelihood of the lamps being accidentally flashed by electrostatic voltage when the array is handled.

The circuit board 43 has a printed circuit thereon, as will be described, for causing sequential flashing of the lamps by firing voltage pulses applied to the terminals 31, 32, or 31', 32'. The top and bottom halves of the printed circuitry preferably are reverse mirror images of each other. The lead-in wires 22a, 22b, etc., of the lamps 22 etc., may be attached to the circuit board 43 in various ways such as by means of metal eyelets 22a', 22b', etc., secured to respective lead-in wires and through holes in the circuit board. The lead-in wires 22a, 22b, etc., pass through openings 52 in the reflector member 41 and through openings 53 in the insulating sheet 42 and into or through the respective pairs of eyelets 22a', 22b', etc., and the ends of the eyelets are crimped to hold the lead-in wires and make electrical contact thereto. The heads of the eyelets are rolled over in electrical contact with the circuit of the circuit board.

In accordance with the invention, as shown in FIGS. 1, 3 and 4, a bead 56 of electrically conductive, pliable adhesive material is disposed to electrically join the reflector member 41, which reflector preferably is made of metal-coated plastic, to an area 57 of an electrical "ground" circuit comprising a continuous conductor run 58 on the circuit board. Conductor run 58 includes, or is connected to, the terminals 31 and 31' and is connected in common and makes contact with one of each of the pairs of connector eyelets for each of the lamps 22, etc., whereby the reflector 41 additionally functions as an electrically grounded shield. More specifically, in the upper half of the circuit board, the common circuit conductor 58 is connected electrically with a respective contact area of the eyelets 22a', 23b', 24b' and 25b'.

Areas 59 on the transparent front housing member 36 may be made opaque or partly opaque, such as by making the surface roughened at these areas, to fully or partially conceal the lamp lead-in wires 22a, 22b, etc., and/or the lower portions of the lamp for an improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead-in wire of flashlamp 25 at eyelet 25a' and terminates at the radiation switch 61. A circuit board connector run 65 is connected to the remaining lead-in wire of flashlamp 23 at eyelet 23a' and terminates at the radiation switch 62. Similarly, a circuit board conductor run 66 is connected to the remaining lead-in wire of flashlamp 22 at eyelet 22b' and terminates at radiation switch 63.

The radiation switches 61, 62, and 63, respectively are in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp upon the lamp being flashed. For this purpose, each of the radiation switches is respectively positioned behind and near to a flashlamp 24, 25, 23. Windows in the form of transparent or openings 69 may be provided in the reflector in front of the switches as shown in FIG. 2 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switches terminals on the circuit board.

As has been explained, the lower portion of the circuit board contains a substantially reverse mirror image of the same circuit shown on the upper part of the circuit board and, therefore, will not be described in detail. It will be noted that the circuit run from the plug-in terminals 31 and 32 at the lower part of the circuit board, extends upwardly so as to activate the circuitry in the upper half of the circuit board. Similarly, when the unit is turned around and tab 20' is plugged into a socket, the circuit board terminal 31' and 32' will be connected to activate the lamps which then will be in the upper half of the circuit board, and hence in the upper half of the flash unit. This accomplishes as has been stated, the desirable characteristic whereby only the group of lamps relatively farthest away from the camera lens axis will be flashed, thereby reducing or eliminating the undesirable red-eye effect.

The circuit on the circuit board 43 of FIG. 2 functions as follows. Assuming that none of the four lamps in the upper half of the unit have been flashed, upon occurrence of a first firing pulse applied across the terminal 31, 32, this pulse will be directly applied to the lead-in wires of the first connected flashlamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25 via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now-closed radiation switch 62 to the third lamp 23, thereby firing the lamp which becomes an open circuit, and the radiation from it causes the radiation switch 63 to become essentially a closed circuit across its terminals. Thus, the next firing pulse will be applied via now-closed radiation switch 63 to the lead-in wires of the fourth flashlamp 22, thereupon causing that lamp to flash. Since this lamp is the last lamp in the active circuit, it does not matter whether its lead-in wires are an open or closed circuit after flashing. Additional flashlamps, radiation switches and electrical conductors can be employed, if desired, using the just-described principals. When the flash unit is turned around and the other connector tab 20' attached to the camera socket, the group of lamps that then become uppermost and relatively farthest away from the lens axis will be in the active circuit and will be flashed in the same manner as has been described. In a preferred embodiment, the lamps 22, etc., are high voltage types requiring 1,000 volts, for example, at low currnt for flashing, and they can be fired by impacting or stressing a piezoelectric element in the camera.

Now again referring to the pliable, electrically conductive adhesive connection 56, the conductive adhesive preferably is deposited, such as from a needle-pointed caulk dispenser, in the form of a bead 56 which is positioned between and adhesively adjoined to a vertical web 73 formed on the reflector unit 41 and the enlarged conductive area 57 of the circuit board. Web 73 is formed by means of openings through the reflector unit 41 flanking the web 73 and also functioning as openings 52 through the reflector unit for the lead-in wires of the lamps 24, 25, 27, and 28. The web 73 may have double walls as shown in FIG. 4. The reflector unit 41 may be of plastic with a metal coating on only its front surface (consisting primarily of the individual reflectors 22' etc.) and the sides of the web 73, whereby the conductive adhesive material 56 is electrically connected to the front surface of the reflector unit.

In an automated production assembly process, the conductive adhesive material 56 may be dispensed in measured doses on conductor area 57 of the circuit board prior to joining the reflector unit 41 therewith, or material 56 may be dispensed at the juncture of reflector web 73 and circuit board conductor area 57 after the assembly of the reflector to the circuit board. A single connecting bead 56 of the adhesive may be used, such as on only one side of the web, or if desired, beads of conductive adhesive 56 may be disposed on each side of the reflector web 73 as shown in FIG. 4. Alternatively, the conductive adhesive may be disposed in any other location where the metallized reflector surface and common circuit element lie in relative proximity to one another.

In order to provide a positive and environmentally stable electrical contact in accordance with the invention, the material 56 should be composed of pliable, electrically conductive, adherent polymeric material. A wide variety of commercially available adhesive types can be used after first rendering them electrically conductive by admixture of a conduction-promoting particulate-type additive such as conductive carbon, metal powders, metal-coated glass beads, etc. The types of adhesive used include hot melts, reactive adhesives (such as epoxy), and solvent type adhesives based on polymers, rubber etc. The use of an adhesive matrix that has low moisture permeability is deemed advantageous with regard to the retention of electrical contact during exposure humid conditions. It appears that the contact points between the conductive particulate filler in the conductive adhesive and the metallized reflector surface are protected from destructive galvanic corrosion by the exclusion of moisture by the organic adhesive resin present. A degree of flexibility or pliability in the cured adhesive is desirable so as to reduce the likelihood of adhesive cracking (and loss of electrical continuity) during handling, thermal cycling, squeezing of the array, or at other times.

By way of specific example, a control group of 25 flip flash units was prepared using the conventional U-shaped clip described in U.S. Pat. No. 3,935,442. A test group of 25 arrays was also prepared from the same lot of lamps and other components except that the spring connector was replaced by a bead 56 of conductive composition such as shown in FIGS. 3 and 4. The conductive material used in this test, Amicon N.B. 2367-36-3, was a urethane-based solvent type vehicle using methyl ethyl ketone as the solvent, and conductive carbon black as the electrical conduction-promoting additive. This paricular material was obtained from Amicon Corporation of Lexington, Mass. A small drop of the conductive adhesive was applied with a syringe so as to join the reflector and circuit board as shown in FIGS. 3 and 4. After the arrays were completely assembled and sealed, the electrical resistance from the common circuit 58 to the reflector surface 41 was measured. All arrays were then placed into an environmental chamber set at 100% relative humidity and 49° C. for a period of 18 days. After removal from the test conditions, the circuit-to-reflector resistance was again measured. In the control group, a number of arrays, both before and after humidity exposure, showed an open circuit or infinite resistance. The averages shown are for those arrays having a measurable resistance; the number of open-circuit arrays is shown independently.

|  | Initial | | | Final (after humidity) | | |
| --- | --- | --- | --- | --- | --- | --- |
|  |  | Open Circuits | |  | Open Circuits | |
|  | Av. R (ohms) | No. | % | Av. R (ohms) | No. | % |
| Control | 40.5 | 6/25 | 24 | 47.5 | 23/25 | 92 |
| Test | 28.6 | 0 |  | 115.6 | 0 |  |

This test clearly shows the advantages of the connecting system disclosed herein. The resistance of the connecting bead 56 may be varied by adjusting the pecentage of conductive agent therein.

Another material found to be particularly suitable for providing the conductive adhesive connection 56 is CHO-BOND 1035 available from Chomerics Incorporated of Woburn, Mass. This is a moisture curing, room temperature vulcanizing (RTV) silicone admixed with silver coated glass beads.

Hence, although the invention has been described with respect to a specific embodiment it will be appreciated that moficiations and changes may be made by those skilled in the art without departing from the true spirit and scope of the invention.

What I claim is:

1. A photoflash unit comprising a plurality of electrically ignitable flashlamps each having a pair of lead-in wires, circuit means containing circuitry for selectively igniting said flashlamps, means electrically connecting the lead-in wires of said flashlamps to said circuitry, said circuitry including a common conductor connected electrically to one lead-in wire of each of said flashlamps, an electrically conductive reflector unit positioned between said lamps and said circuit means and shaped to reflect light from said lamps when flashed, and means electrically connecting said conductive reflector unit to said common circuit conductor, said last-mentioned connecting means comprising an electrically conductive adhesive material positioned between and adhesively joined to said conductive reflector unit and said common circuit conductor.

2. The photoflash unit of claim 1 wherein said conductive adhesive material comprises a pliable, adherent polymeric material admixed with a conduction-promoting particulate type additive.

3. The photoflash unit of claim 2 wherein said conductive adhesive material comprises a moisture curing, room temperature vulcanizing silicone admixed with silver coated glass beads.

4. The photoflash unit of claim 1 wherein said circuit means comprises a circuit board, said circuitry is disposed on a surface of said circuit board, said flashlamps are positioned over said surface, said common circuit conductor includes an enlarged conductive area on said circuit board, said reflector unit includes a web aligned with said enlarged conductive area, and said conductive adhesive material is positioned between and adhesively joined to said web of the conductive reflector unit and said enlarged conductive area on the circuit board.

5. The photoflash unit of claim 4 wherein said web includes sides and is flanked by openings extending through said reflector unit from front to back thereof, said reflector unit being made of plastic material coated with an electrically conductive material at least over the front surface thereof and over the sides of said web.

* * * * *